United States Patent [19]

Kishimoto

[11] 4,086,752

[45] May 2, 1978

[54] ELECTRONIC TIMEPIECE

[75] Inventor: Hiroo Kishimoto, Tokyo, Japan

[73] Assignee: Kabushiki Kaisha Daini Seikosha, Japan

[21] Appl. No.: 727,988

[22] Filed: Sep. 29, 1976

[30] Foreign Application Priority Data

Sep. 30, 1975 Japan ............................ 50-118505

[51] Int. Cl.² .................... G04B 19/34; G04C 3/00
[52] U.S. Cl. .................. 58/23 R; 58/23 AC;
58/23 BA; 58/23 V; 58/50 R; 58/88 R; 174/52
S; 361/400
[58] Field of Search ............ 58/23 R, 23 AC, 23 BA,
58/50 R, 88 R, 23 V; 174/52 R, 52 S; 361/397,
399, 400, 402

[56] References Cited

U.S. PATENT DOCUMENTS

| | | | |
|---|---|---|---|
| 3,905,666 | 9/1975 | Grimm et al. | 58/23 R X |
| 3,959,964 | 6/1976 | Yamazaki | 58/50 R |
| 3,975,899 | 8/1976 | Haber | 58/88 R |
| 4,015,422 | 4/1977 | Van Haaften | 58/23 R X |
| 4,042,861 | 8/1977 | Yasuda et al. | 361/400 |

*Primary Examiner*—Stanley J. Witkowski
*Attorney, Agent, or Firm*—Robert E. Burns; Emmanuel J. Lobato; Bruce L. Adams

[57] ABSTRACT

A molded printed circuit board mounted in the case of an electronic timepiece has on its back side an oscillating circuit including a quartz crystal element and a condenser, an integrated time keeping circuit and a compartment for a battery. On the front side of the molded printed circuit board there are a plurality of terminal electrodes connected to outputs of the time keeping circuit. Display means mounted in the front of said case overlies the front side of the molded printed circuit board and is connected thereto by a rubber disc connector having conductive portions for electrically connecting input electrodes of the display means with corresponding terminal electrodes on the front side of the molded printed circuit board.

7 Claims, 4 Drawing Figures

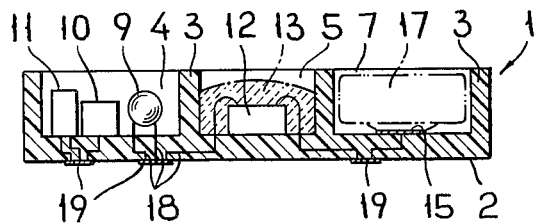
FIG. 1
FIG. 2
FIG. 3
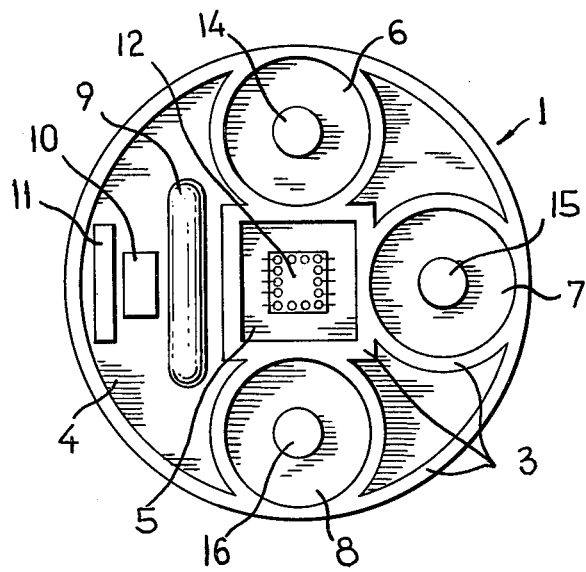
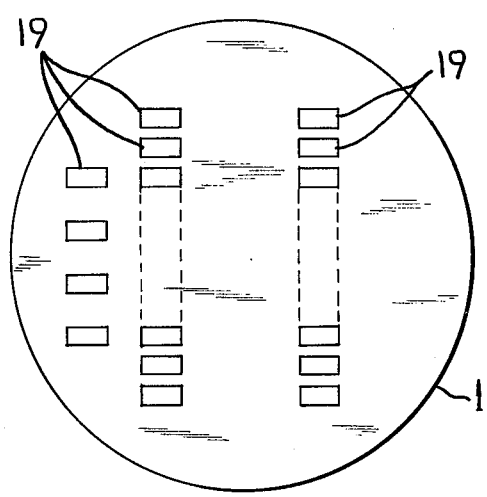
FIG. 4
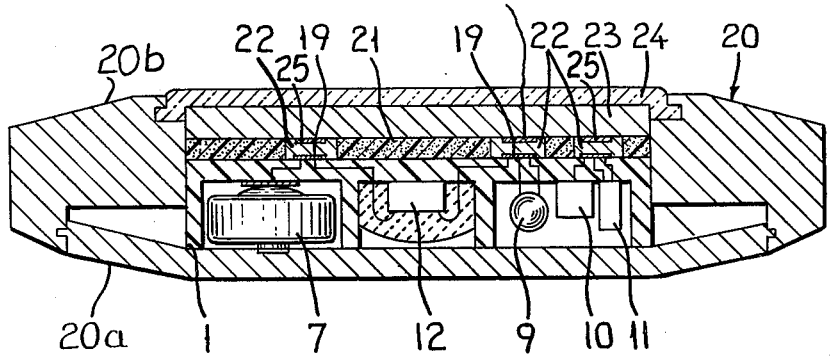

ELECTRONIC TIMEPIECE

FIELD OF INVENTION

The present invention relates to an electronic timepiece and especially to means for mounting the electronic parts in such manner as to facilitate construction of the timepiece.

BACKGROUND OF INVENTION

Generally, an electronic timepiece is composed of an oscillating circuit for producing an oscillating signal as a time standard, a dividing circuit for dividing the oscillating signal, a time keeping circuit including a counting circuit and a driving circuit, a display portion for displaying the time measured by the time keeping circuit and a power supply.

In a conventional type of electronic timepiece, many electronic parts comprising one or more IC-chips, a quartz element and a trimmer condenser comprising the electronic circuit were mounted on a plurality of disctype printed circuit boards. The many electronic parts have to be precisely mounted on the circuit boards and the electric connections between the electronic parts and electrodes were attained by soldering. The assembling operation was hence very complicated and time consuming and it was impossible to increase the manufacturing efficiency. Furthermore, the reliability of the solder connections between the several parts was very low whereby many defective assemblies were produced.

SUMMARY OF INVENTION

It is an object of the present invention to eliminate the above noted difficulties and insufficiencies by providing an electronic timepiece in which the several parts of the time keeping circuit are mounted on a single molded printed circuit board and connected without solder connections to display means whereby the manufacturing efficiency and reliability of the timepiece are greatly increased.

In accordance with the present invention, a molded printed circuit board mounted in the timepiece case has on its back side an oscillating circuit including a quartz crystal element and a condenser, an integrated time keeping circuit and connections for a power source and has on its front side a plurality of terminal electrodes connected to outputs of the time keeping circuit. Time display means mounted in the front of the case and overlying the front side of the molded printed circuit board is connected to the terminals of the printed circuit board by an intervening connector having conductive portions making contact connections between input electrodes of the display means and the terminal electrodes on the front side of the molded printed circuit board.

BRIEF DESCRIPTION OF DRAWINGS

The nature, objects and advantages of the invention will be more fully understood from the following description of a preferred embodiment illustrated by way of example in the accompanying drawings in which:

FIG. 1 is a cross sectional view of a printed circuit board of an electronic watch in accordance with the present invention;

FIG. 2 is a plan view of the back side of the circuit board shown in FIG. 1;

FIG. 3 is a plan view of the front side of the printed circuit board shown in FIG. 1; and FIG. 4 is a cross sectional view of an electronic watch employing the printed circuit board illustrated in FIGS. 1, 2 and 3.

DESCRIPTION OF PREFERRED EMBODIMENT

As illustrated by way of example in FIGS. 1 to 3, a printed circuit board 1 is molded of insulating molding material, for example a synthetic resin. On its back side the printed circuit board 1 has rearwardly projecting wall portions 3 including a peripheral wall and partition walls defining a plurality of hole-shaped mounting compartments 4, 5, 6, 7 and 8. A quartz element 9 for the oscillating circuit, a trimmer condenser 10 and a temperature compensating condenser 11 are mounted in the compartment 4 and are molded to the printed circuit board 1 at the same time that the printed circuit board is molded. An IC-chip 12 comprising the time keeping circuits including the oscillating, dividing and counting circuits is mounted in the compartment 5 of the printed circuit board 1 and is molded to the printed circuit board by molding material at the same time that the printed circuit board is molded. Moreover, the IC-chip 12 is sealed in the compartment 5 by molding material 13. Electrodes 14, 15 and 16 of thin copper plate are shaped to the central portions of compartments 6, 7 and 8 respectively and batteries 17 as an energy source are mounted in the compartments 6, 7 and 8 in contact with the electrodes.

The lead terminals 18 of the quartz element 9, trimmer condenser 10, temperature compensating condenser 11, IC-chip 12 and the electrodes 14, 15 and 16 extend through the base portion 2 of the circuit board 1 so as to extend to the front face of the circuit board. These terminals are molded in the circuit board 1 when the circuit board is molded. Terminal electrodes 19 as indicated in FIG. 3 are provided on the front surface portion of the printed circuit board 1 and are electrically connected to the lead terminals 18. The terminal electrodes 19 are formed by eliminating by etching the unnecessary thin metal portion plated or otherwise provided on the front surface of the printed circuit board 1. Thus, the electronic parts shown in FIGS. 1, 2 and 3 with the exception of the battery 17 are assembled on the circuit board 1 by the molding of the circuit board and the connections for these electronic parts are molded in the circuit board in the same molding operation.

The circuit board 1 with the electronic parts mounted thereon as described above is mounted in a watchcase 20 having a back 20a and front 20b as illustrated in FIG. 4. The circuit board is mounted with the back side of the circuit board facing the back 20a of the watchase. It will be seen that the wall portions 3 engage the removable back of the case and thereby protect the electronic parts 9, 10, 11 and 12. A connector 21 having a plurality of electroconductive portions 22 is mounted on the front surface of the printed circuit board 1 with the electroconductive portions 22 engaging the terminal electrodes 19. A display member 23 for displaying time, date and day of the week is mounted on the connector 21 and has on its back side a plurality of input electrodes 25 which are electrically connected to the terminal electrodes 19 of the printed circuit board by the electroconductive portions 22 of the connector 21. Thus, the contents of the time keeping circuit are displayed by the display member 23 which is covered by a translucent cover shown as a watch glass 24.

The connector 21 is preferably composed of a rubber disc having suitable electroconductive portions 22 so that electrical connections between the input electrodes 25 of the display member 23 and the terminal electrodes 19 of the printed circuit board 1 are provided by pressure contact, thereby eliminating the need of soldered connections between the terminal electrodes 19 of the circuit board and the input electrodes 25 of the display member 23.

It will thus be seen that since the printed circuit board assembly shown in FIGS. 1 to 3 is formed in a molding operation and since the circuit board is connected to the display member 23 by the connecting member 21, an electronic watch in accordance with the present invention can be easily manufactured and assembled. As seen in FIG. 4, the display member 23, connector 21 and printed circuit board 1 with the electronic parts thereon can be assembled from the back of the watch case 20 and can be held in place in assembled condition by screwing on the back of the case. The display member 23, connector 21 and circuit board 1 are positioned relative to one another by the case so as to assure correct electrical connections.

While a preferred embodiment of the invention has been illustrated in the drawings and is herein particularly described, it will be understood that many variations and modifications can be made and hence the invention is in no way limited to the illustrated embodiment.

What I claim is:

1. An electronic timepiece comprising a case having a back and a front, a molded printed circuit board having on a back side thereof an oscillating circuit including a quartz crystal element and a condenser, an integrated time keeping circuit and connections for a power source, and having on a front side thereof a plurality of terminal electrodes connected to outputs of said time keeping circuit, said molded printed circuit board being mounted in said case with said back side thereof toward the back of the case, display means with a translucent cover mounted in the front of said case and overlying the front side of said molded printed circuit board, said display means having on a back side thereof a plurality of input electrodes, and connecting means disposed between said molded printed circuit board and said display means and electrically connecting said input electrodes of said display means to said terminal electrodes of said molded printed circuit board.

2. An electronic timepiece according to claim 1, in which said molded printed circuit board comprises a front base portion and rearwardly projecting wall portions including a peripheral wall portion and wall portions defining compartments for said quartz crystal element, condenser, integrated circuit and for a power source for connection with said power source connections.

3. An electronic timepiece according to claim 2, in which said compartments include a central compartment for said integrated circuit.

4. An electronic timepiece according to claim 1, in which said connecting means comprises a rubber disc having electroconductive portions making electrical contact connections with said input electrodes of said display means and said terminal electrodes on the front side of said molded printed circuit board.

5. An electronic timepiece according to claim 2, in which said integrated time keeping circuit is sealed in one of said compartments with a molding material.

6. An electronic timepiece according to claim 2, in which said wall portions of said molded printed circuit board engage the back of said case and thereby protect said quartz crystal element, condenser, integrated circuit and power source in said compartments.

7. An electronic timepiece according to claim 6, in which the back of said case is removable and said display means, connecting means and molded printed circuit board are held in place in assembled condition by the back of said case.

* * * * *